United States Patent
Ropel et al.

(10) Patent No.: US 12,377,754 B2
(45) Date of Patent: Aug. 5, 2025

(54) AUTOMATED VEHICLE BATTERY HEALTH OPTIMIZATION

(71) Applicant: Volvo Car Corporation, Gothenburg (SE)

(72) Inventors: Andreas Martin Viktor Ropel, Gothenburg (SE); Ben Peter Lloyd, Gothenburg (SE); Matthias Yannick Philippe Le Saux, Gothenburg (SE); Konstantinos Chatziioannou, Gothenburg (SE); Klas Roland Persson Signell, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 351 days.

(21) Appl. No.: 18/050,518

(22) Filed: Oct. 28, 2022

(65) Prior Publication Data

US 2024/0140264 A1    May 2, 2024

(51) Int. Cl.
*B60L 58/16* (2019.01)
*B60L 53/62* (2019.01)
(Continued)

(52) U.S. Cl.
CPC .............. *B60L 58/16* (2019.02); *B60L 53/62* (2019.02); *B60W 60/0015* (2020.02);
(Continued)

(58) Field of Classification Search
CPC .......... B60L 2200/12; B60L 2240/545; B60L 2240/60; B60L 2240/62; B60L 2240/64;
(Continued)

(56) References Cited

U.S. PATENT DOCUMENTS

| | | |
|---|---|---|
| 9,956,887 B2 | 5/2018 | Duan et al. |
| 10,723,238 B2 | 7/2020 | Hortop et al. |

(Continued)

FOREIGN PATENT DOCUMENTS

JP    5341823 B2    11/2013

OTHER PUBLICATIONS

KIA | "How to extend EV battery life?", website https://www.kia.com/dm/discover-kia/ask/how-to-extend-ev-battery-life.html, last accessed Sep. 21, 2022, 2 pages.

(Continued)

*Primary Examiner* — Charles J Han
(74) *Attorney, Agent, or Firm* — Amin, Turocy & Watson, LLP

(57) ABSTRACT

Automated vehicle battery health optimization (e.g., using a computerized tool) is enabled. For example, a system can comprise a memory that stores computer executable components, and a processor that executes the computer executable components stored in the memory, wherein the computer executable components comprise: a battery health component that, using a defined battery health algorithm and a battery sensor, determines degradation of a battery of a vehicle, and an execution component that, based on the degradation of the battery and a traveling direction of a user of the vehicle, external to the vehicle, facilitates an action determined to mitigate further degradation of the battery.

20 Claims, 11 Drawing Sheets

(51) Int. Cl.
*B60W 60/00* (2020.01)
*H01M 10/42* (2006.01)
*H02J 7/00* (2006.01)

(52) U.S. Cl.
CPC ......... *H01M 10/425* (2013.01); *H02J 7/0013* (2013.01); *H02J 7/00302* (2020.01); *B60L 2200/12* (2013.01); *B60W 2300/36* (2013.01); *B60W 2510/246* (2013.01); *H01M 2010/4271* (2013.01); *H01M 2220/20* (2013.01)

(58) Field of Classification Search
CPC ............. B60L 2240/66; B60L 2240/70; B60L 2250/16; B60L 2260/46; B60L 53/62; B60L 58/16; B60W 2300/36; B60W 2510/246; B60W 60/0015; G01R 31/392; G06Q 50/06; H01M 10/425; H01M 2010/4271; H01M 2220/20; H02J 7/0013
See application file for complete search history.

(56) References Cited

U.S. PATENT DOCUMENTS

| | | | |
|---|---|---|---|
| 11,724,615 | B2 | 8/2023 | Suzuki |
| 11,921,163 | B2 | 3/2024 | Negoita et al. |
| 2021/0001744 | A1* | 1/2021 | Suzuki .................... B60L 50/50 |
| 2024/0083301 | A1 | 3/2024 | Mankowski et al. |
| 2024/0085487 | A1 | 3/2024 | Negoita et al. |
| 2024/0140240 | A1 | 5/2024 | Ropel et al. |
| 2024/0140264 | A1 | 5/2024 | Ropel et al. |
| 2024/0140265 | A1 | 5/2024 | Ropel et al. |
| 2024/0192282 | A1* | 6/2024 | Hiratsuka ............ G01R 31/396 |

OTHER PUBLICATIONS

Fanoro, M. et al. | "A Review of the Impact of Battery Degradation on Energy Management Systems with a Special Emphasis on Electric Vehicles". Energies 2022, 15, 5889, https://doi.org/10.3390/en15165889, published: Aug. 14, 2022, 29 pages.

Extended European Search Report Received for European Patent Application Serial No. 23205606.9 dated Mar. 1, 2024, 7 pages.

Communication Pursuant to Rule 69 EPC received for European Patent Application Serial No. 23205606.9 dated May 7, 2024, 2 pages.

Notice of Allowance for U.S. Appl. No. 18/050,522 dated Feb. 20, 2025.

Communication pursuant to Article 94(3) EPC for EP Application No. 23 205 606.9 dated Dec. 2, 2024.

Office Action for U.S. Appl. No. 18/050,522 dated Sep. 24, 2024.

\* cited by examiner

AUTOMATED VEHICLE BATTERY HEALTH OPTIMIZATION

TECHNICAL FIELD

The disclosed subject matter relates to battery operated vehicles (e.g., transportation vehicles) and, more particularly, to optimizing vehicle battery health.

BACKGROUND

Electric vehicles are becoming increasingly prevalent worldwide, and are poised to become one of the most common modes of transportation. With this pivot in transportation technology, there exist increasing power demands on batteries or battery packs of electric vehicles. With this increased power demand, and during the use of electric vehicles, batteries of electric vehicles can become degraded, thus reducing electric vehicle power or range. Eventually, battery degradation can lead to costly battery repairs or replacement of corresponding electric vehicles.

The above-described background relating to vehicle batteries and systems is merely intended to provide a contextual overview of some current issues and is not intended to be exhaustive. Other contextual information may become further apparent upon review of the following detailed description.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, apparatuses and/or computer program products that facilitate vehicle battery health optimization are described.

As alluded to above, vehicle battery health optimization can be improved in various ways, and various embodiments are described herein to this end and/or other ends.

According to an embodiment, a system can comprise a memory that stores computer executable components, and a processor that executes the computer executable components stored in the memory, wherein the computer executable components can comprise: a battery health component that, using a defined battery health algorithm and a battery sensor, determines degradation of a battery of a vehicle, and an execution component that, based on the degradation of the battery and a traveling direction of a user of the vehicle, external to the vehicle, facilitates an action determined to mitigate further degradation of the battery.

According to another embodiment, a non-transitory machine-readable medium can comprise executable instructions that, when executed by a processor, facilitate performance of operations, comprising: using a defined battery health algorithm and a battery sensor, determining degradation of a battery of a vehicle, and based on the degradation of the battery and a traveling direction of a user of the vehicle, external to the vehicle, facilitating an action determined to mitigate further degradation of the battery.

According to yet another embodiment, a method can comprise: using a defined battery health algorithm and a battery sensor, determining, by a system comprising a processor, degradation of a battery of a vehicle, and based on the degradation of the battery and a traveling direction of a user of the vehicle, external to the vehicle, facilitating, by the system, an action determined to mitigate further degradation of the battery.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

It will be understood that when an element is referred to as being "coupled" to another element, it can describe one or more different types of coupling including, but not limited to, chemical coupling, communicative coupling, capacitive coupling, electrical coupling, electromagnetic coupling, inductive coupling, operative coupling, conductive coupling, acoustic coupling, ultrasound coupling, optical coupling, physical coupling, thermal coupling, and/or another type of coupling. As referenced herein, an "entity" can comprise a human, a client, a user, a computing device, a software application, an agent, a machine learning model, an artificial intelligence, and/or another entity. It should be appreciated that such an entity can facilitate implementation of the subject disclosure in accordance with one or more embodiments the described herein.

The computer processing systems, computer-implemented methods, apparatus and/or computer program products described herein employ hardware and/or software to solve problems that are highly technical in nature (e.g., determining and/or executing one or more actions determined to optimize vehicle battery health), that are not abstract and cannot be performed as a set of mental acts by a human.

Various embodiments herein can monitor battery degradation and/or provide feedback to a user regarding one or more causes of battery degradation in a vehicle. Such feedback can be provided, for instance, via an infotainment system of a vehicle.

Figure 1:
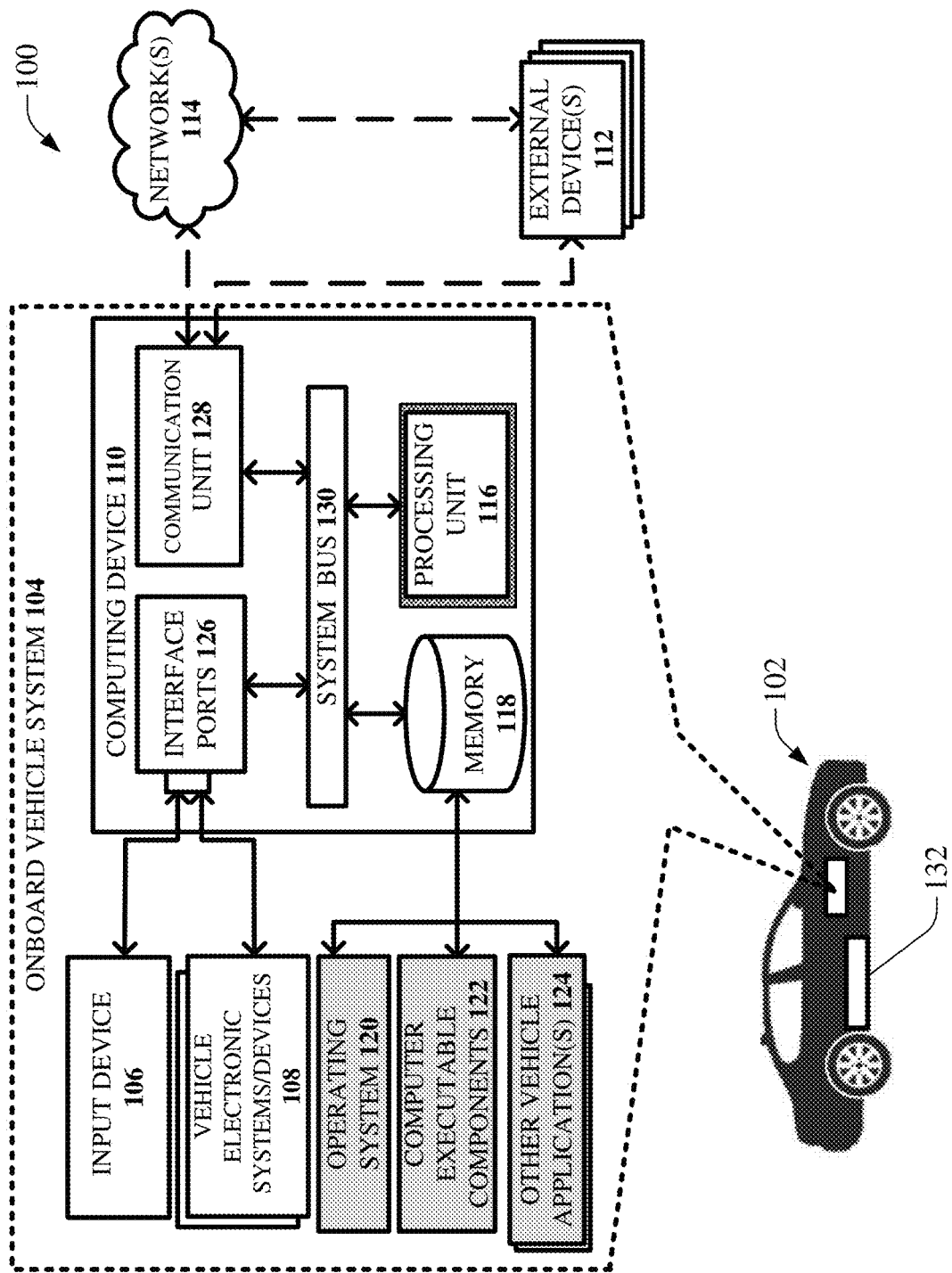
FIG. 1 illustrates a block diagram of an exemplary system in accordance with one or more embodiments described herein.

Turning now to FIG. 1, there is illustrated an example, non-limiting system 100 in accordance with one or more embodiments herein. System 100 can comprise a computerized tool, which can be configured to perform various operations relating to automated vehicle battery health optimization. In accordance with various exemplary embodiments, system 100 can be deployed on or within a vehicle 102, (e.g., an automobile, as shown in FIG. 1). Although FIG. 1 depicts the vehicle 102 as an automobile, the architecture of the system 100 is not so limited. For instance, the system 100 described herein can be implemented with a variety of types of vehicles 102. Example vehicles 102 that can incorporate the exemplary system 100 can include, but are not limited to: automobiles (e.g., autonomous vehicles), airplanes, trains, motorcycles, carts, trucks, semi-trucks, buses, boats, recreational vehicles, helicopters, jets, electric scooters, electric bicycles, a combination thereof, and/or the like. It is additionally noted that the system 100 can be implemented in a variety of types of automobiles, such as battery electric vehicles, hybrid vehicles, plug-in hybrid vehicles, or other suitable types of vehicles.

As shown in FIG. 1, the system 100 can comprise one or more onboard vehicle systems 104, which can include one or more input devices 106, one or more other vehicle electronic systems and/or devices 108, and/or one or more computing devices 110. Additionally, the system 100 can comprise one or more external devices 112 that can be communicatively and/or operatively coupled to the one or more computing devices 110 of the one or more onboard vehicle systems 104 either via a one or more networks 114 and/or a direct electrical connection (e.g., as shown in FIG. 1). In various embodiments, one or more of the onboard vehicle system 104, input devices 106, vehicle electronic systems and/or devices 108, computing devices 110, external devices 112, and/or networks 114 can be communicatively or operably coupled (e.g., over a bus or wireless network) to one another to perform one or more functions of the system 100.

The one or more input devices 106 can display one or more interactive graphic entity interfaces ("GUIs") that facilitate accessing and/or controlling various functions and/or application of the vehicle 102. The one or more input devices 106 can display one or more interactive GUIs that facilitate accessing and/or controlling various functions and/or applications. The one or more input devices 106 can comprise one or more computerized devices, which can include, but are not limited to: personal computers, desktop computers, laptop computers, cellular telephones (e.g., smartphones or mobile devices), computerized tablets (e.g., comprising a processor), smart watches, keyboards, touchscreens, mice, a combination thereof, and/or the like. An entity or user of the system 100 can utilize the one or more input devices 106 to input data into the system 100. Additionally, the one or more input devices 106 can comprise one or more displays that can present one or more outputs generated by the system 100 to an entity. For example, the one or more displays can include, but are not limited to: cathode tube display ("CRT"), light-emitting diode display ("LED"), electroluminescent display ("ELD"), plasma display panel ("PDP"), liquid crystal display ("LCD"), organic light-emitting diode display ("OLED"), a combination thereof, and/or the like.

For example, the one or more input devices 106 can comprise a touchscreen that can present one or more graphical touch controls that can respectively correspond to a control for a function of the vehicle 102, an application, a function of the application, interactive data, a hyperlink to data, and the like, wherein selection and/or interaction with the graphical touch control via touch activates the corresponding functionality. For instance, one or more GUIs displayed on the one or more input devices 106 can include selectable graphical elements, such as buttons or bars corresponding to a vehicle navigation application, a media application, a phone application, a back-up camera function, a car settings function, a parking assist function, and/or the like. In some implementations, selection of a button or bar corresponding to an application or function can result in the generation of a new window or GUI comprising additional selectable icons or widgets associated with the selected application. For example, selection of one or more selectable options herein can result in generation of a new GUI or window that includes additional buttons or widgets with one or more selectable options. The type and appearance of the controls can vary. For example, the graphical touch controls can include icons, symbols, widgets, windows, tabs, text, images, a combination thereof, and/or the like.

The one or more input devices 106 can comprise suitable hardware that registers input events in response to touch (e.g., by a finger, stylus, gloved hand, pen, etc.). In some implementations, the one or more input devices 106 can detect the position of an object (e.g., by a finger, stylus, gloved hand, pen, etc.) over the one or more input devices 106 within close proximity (e.g., a few centimeters) to touchscreen without the object touching the screen. As used herein, unless otherwise specified, reference to "on the touchscreen" refers to contact between an object (e.g., an entity's finger) and the one or more input devices 106 while reference to "over the touchscreen" refers to positioning of an object within close proximity to the touchscreen (e.g., a defined distance away from the touchscreen) yet not contacting the touchscreen.

The type of the input devices 106 can vary and can include, but is not limited to: a resistive touchscreen, a surface capacitive touchscreen, a projected capacitive touchscreen, a surface acoustic wave touchscreen, and an infrared touchscreen. In various embodiments, the one or more input devices 106 can be positioned on the dashboard of the vehicle 102, such as on or within the center stack or center console of the dashboard. However, the position of the one or more input devices 106 within the vehicle 102 can vary.

The one or more other vehicle electronic systems and/or devices 108 can include one or more additional devices and/or systems (e.g., in addition to the one or more input devices 106 and/or computing devices 110) of the vehicle 102 that can be controlled based at least in part on commands issued by the one or more computing devices 110 (e.g., via one or more processing units 116) and/or commands issued by the one or more external devices 112 communicatively coupled thereto. For example, the one or more other vehicle electronic systems and/or devices 108 can comprise: a media system (e.g., audio and/or video); a back-up camera system; a heating, ventilation, and air conditioning ("HVAC") system; a lighting system; a cruise control system, a power locking system, a navigation system, an autonomous driving system, a vehicle sensor system, telecommunications system, a combination thereof, and/or the like. Other example other vehicle electronic systems and/or devices 108 can comprise one or more sensors, which can comprise odometers, altimeters, speedometers, accelerometers, engine features and/or components, fuel meters, flow meters, cameras (e.g., digital cameras, heat cameras, infrared cameras, and/or the like), lasers, radar systems, lidar systems, microphones, vibration meters, moisture sensors, thermometers, seatbelt sensors, wheel speed sensors, a combination thereof, and/or the like. For instance, a speedometer of the vehicle 102 can detect the vehicle's 102 traveling speed. Further, the one or more sensors can detect and/or measure one or more conditions outside the vehicle 102, such as: whether the vehicle 102 is traveling through a rainy environment; whether the vehicle 102 is traveling through winter conditions (e.g., snowy and/or icy conditions); whether the vehicle 102 is traveling through very hot conditions (e.g., desert conditions); and/or the like. Example navigational information can include, but is not limited to: the destination of the vehicle 102, the position of the vehicle 102, the type of vehicle 102, the speed of the vehicle 102, environmental conditions surrounding the vehicle 102, the planned route of the vehicle 102, traffic conditions expected to be encountered by the vehicle 102, operational status of the vehicle 102, a combination thereof, and/or the like.

The one or more computing devices 110 can facilitate executing and controlling one or more operations of the vehicle 102, including one or more operations of the one or more input devices 106, and the one or more other vehicle electronic systems/devices 108 using machine-executable instructions. In this regard, embodiments of system 100 and other systems described herein can include one or more machine-executable components embodied within one or more machines (e.g., embodied in one or more computer readable storage media associated with one or more machines, such as computing device 110). Such components, when executed by the one or more machines (e.g., processors, computers, virtual machines, etc.) can cause the one or more machines to perform the operations described.

For example, the one or more computing devices 110 can include or be operatively coupled to at least one memory 118 and/or at least one processing unit 116. The one or more processing units 116 can be any of various available processors. For example, dual microprocessors and other multiprocessor architectures also can be employed as the processing unit 116. In various embodiments, the at least one memory 118 can store software instructions embodied as functions and/or applications that when executed by the at least one processing unit 116, facilitate performance of operations defined by the software instruction. In the embodiment shown, these software instructions can include one or more operating system 120, one or more computer-executable components 122, and/or one or more other vehicle applications 124. For example, the one or more operating systems 120 can act to control and/or allocate resources of the one or more computing devices 110. It is to be appreciated that the claimed subject matter can be implemented with various operating systems or combinations of operating systems.

The one or more computer executable components 122 and/or the one or more other vehicle applications 124 can take advantage of the management of resources by the one or more operating systems 120 through program modules and program data also stored in the one or more memories 118. The one or more computer executable components 122 can provide various features and/or functionalities that can facilitate battery health optimization and/or degradation mitigation herein. Example, other vehicle applications 124 can include, but are not limited to: a navigation application, a media player application, a phone application, a vehicle settings application, a parking assistance application, an emergency roadside assistance application, a combination thereof, and/or the like. The features and functionalities of the one or more computer executable components 122 are discussed in greater detail infra.

The one or more computing devices 110 can further include one or more interface ports 126, one or more communication units 128, and a system bus 130 that can communicatively couple the various features of the one or more computing devices 110 (e.g., the one or more interface ports 126, the one or more communication units 128, the one or more memories 118, and/or the one or more processing units 116). The one or more interface ports 126 can connect the one or more input devices 106 (and other potential devices) and the one or more other vehicle electronic systems/devices 108 to the one or more computing devices 110. For example, the one or more interface ports 126 can include, a serial port, a parallel port, a game port, a universal serial bus ("USB") and the like.

The one or more communication units 128 can include suitable hardware and/or software that can facilitate connecting one or more external devices 112 to the one or more computing devices 110 (e.g., via a wireless connection and/or a wired connection). For example, the one or more communication units 128 can be operatively coupled to the one or more external devices 112 via one or more networks 114. The one or more networks 114 can include wired and/or wireless networks, including but not limited to, a personal area network ("PAN"), a local area network ("LAN"), a cellular network, a wide area network ("WAN", e.g., the Internet), and the like. For example, the one or more external devices 112 can communicate with the one or more computing devices 110 (and vice versa) using virtually any desired wired or wireless technology, including but not limited to: wireless fidelity ("Wi-Fi"), global system for mobile communications ("GSM"), universal mobile telecommunications system ("UMTS"), worldwide interoperability for microwave access ("WiMAX"), enhanced general packet radio service (enhanced "GPRS"), fifth generation ("5G") communication system, sixth generation ("6G") communication system, third generation partnership project ("3GPP") long term evolution ("LTE"), third generation partnership project 2 ("3GPP2") ultra-mobile broadband ("UMB"), high speed packet access ("HSPA"), Zigbee and other 802.XX wireless technologies and/or legacy telecommunication technologies, near field communication ("NFC") technology, BLUETOOTH®, Session Initiation Protocol ("SIP"), ZIGBEE®, RF4CE protocol, WirelessHART protocol, 6LoWPAN (IPv6 over Low power Wireless Area Networks), Z-Wave, an ANT, an ultra-wideband ("UWB") standard protocol, and/or other proprietary and non-proprietary communication protocols. In this regard, the one or more communication units 128 can include software, hardware, or a combination of software and hardware that is configured to facilitate wired and/or wireless communication between the one or more computing devices 110 and the one or more external devices 112. While the one or more communication units 128 are shown for illustrative clarity as a separate unit that is not stored within memory 118, it is to be appreciated that one or more (software) components of the communication unit can be stored in memory 118 and include computer executable components.

The one or more external devices 112 can include any suitable computing device comprising a display and input device (e.g., a touchscreen) that can communicate with the one or more computing devices 110 comprised within the onboard vehicle system 104 and interface with the one or more computer executable components 122 (e.g., using a suitable application program interface ("API")). For example, the one or more external devices 112 can include, but are not limited to: a mobile phone, a smartphone, a tablet personal computer ("PC"), a digital assistant ("PDA"), a heads-up display ("HUD"), virtual reality ("VR") headset, an augmented reality ("AR") headset, or another type of wearable computing device, a desktop computer, a laptop computer, a computer tablet, a combination thereof, and the like.

Figure 2:
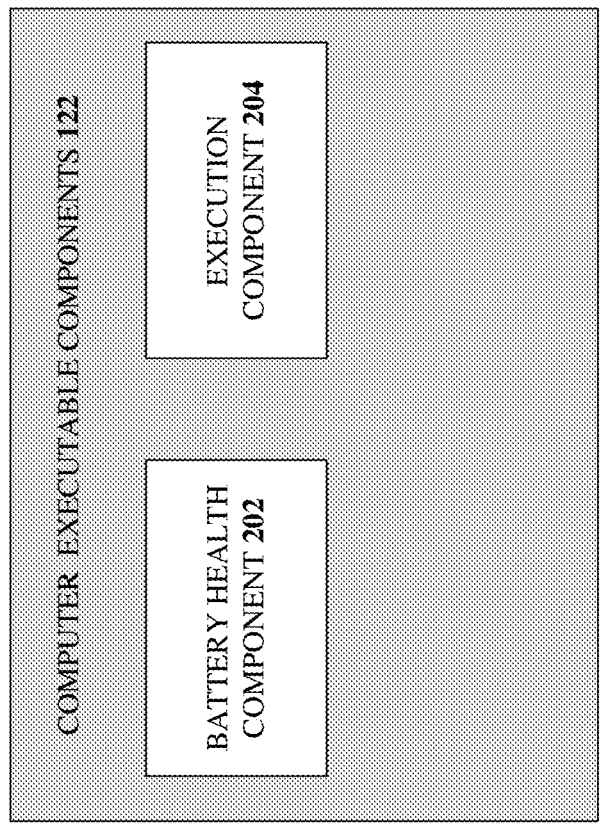
FIG. 2 illustrates a block diagram of example, non-limiting computer executable components in accordance with one or more embodiments described herein.

FIG. 2 illustrates a block diagram of example, non-limiting computer executable components 122 that can facilitate automated vehicle battery health optimization in accordance with one or more embodiments described herein. Repetitive description of like elements employed in other embodiments described herein is omitted for sake of brevity. As shown in FIG. 2, the one or more computer executable components 122 can include battery health component 202 and/or execution component 204.

In various embodiments herein, the onboard vehicle system 104 can be configured to determine and/or monitor one or more battery health metrics of a battery 132 of a vehicle 102. In some embodiments, the battery 132 can in part, or in whole, comprise the system 104, though in other embodiments, the system 104 is external to the battery 132. According to an embodiment, the battery health component 202 can (e.g., using a defined battery health algorithm and/or a battery sensor) determine degradation of the battery 132 of the vehicle 102. In this regard, the vehicle electronic systems/devices 108 can comprise a battery sensor that can be utilized by the battery health component 202 to monitor and/or determine one or more battery health metrics represented in the battery health of the battery 132. In various embodiments, the battery health component 202 can determine a health of the battery 132 (e.g., such a state of age or degradation of the battery cell 132), according to one or more defined health metrics, based on an output of the battery sensor. In various embodiments, a defined health metric can comprise a difference between a previous impedance of the battery 132 and a current impedance of the battery 132. In further embodiments, the defined health metric can comprise a difference between an impedance of one cell of the battery 132 and a second cell of the battery 132 (e.g., of a common battery pack). In further embodiments, the defined health metric can be based on an output of the battery sensor (e.g., a voltage and/or a temperature). In this regard, the battery health component 202 can determine a health of the battery 132 based on an output of the battery sensor (e.g., according to a defined voltage and/or temperature metric).

Based on the health of the battery 132 as determined using the battery health component 202, the execution component 204 can (e.g., based on the degradation of the battery and/or a traveling direction of a user of the vehicle 102, external to the vehicle) facilitate an action determined to mitigate further degradation of the battery, as later discussed in greater detail. It is noted that, in various implementations, the battery 132 can comprise a solid-state battery. In additional implementations, the battery 132 can comprise a solid-state battery pack, made up of one or more electrically coupled solid-state battery sections. In further implementations, the battery 132 can comprise one or more battery cells (e.g., lithium battery cells), thus comprising a single-cell battery 132 or a multi-cell battery 132.

Figure 3:
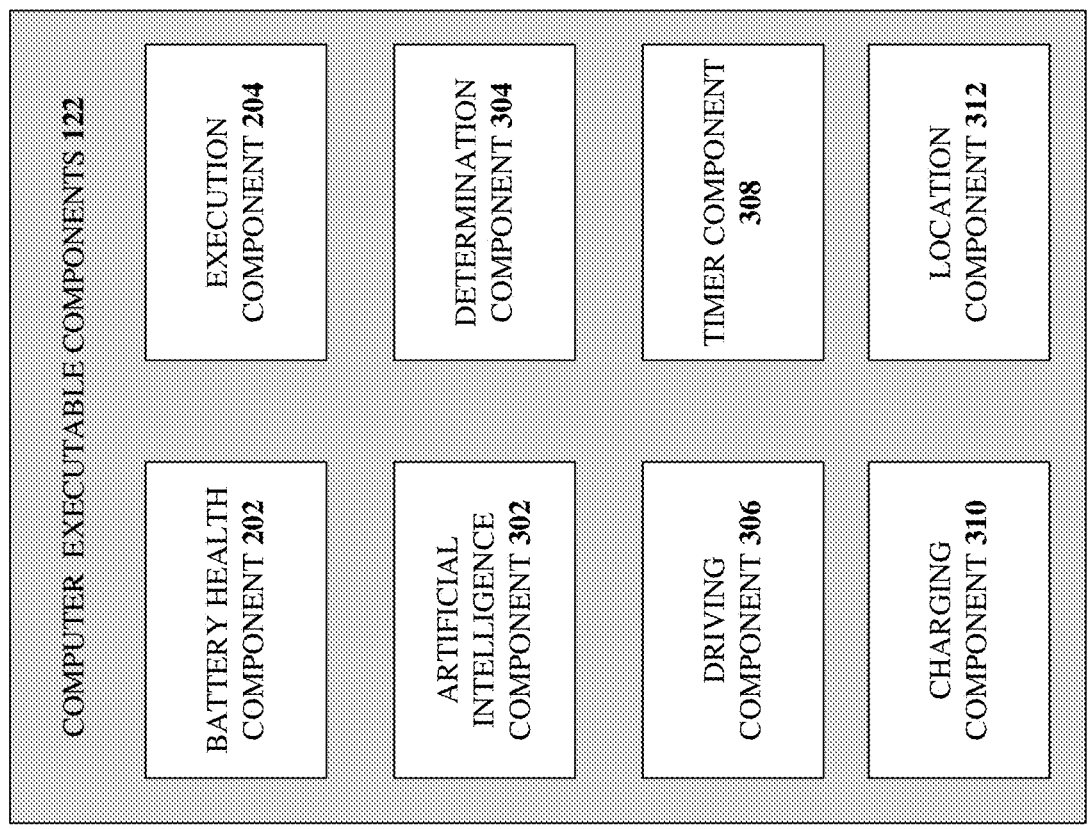
FIG. 3 illustrates a block diagram of example, non-limiting computer executable components in accordance with one or more embodiments described herein.

FIG. 3 illustrates a block diagram of example, non-limiting computer executable components 122 that can facilitate automated vehicle battery health optimization in accordance with one or more embodiments described herein. Repetitive description of like elements employed in other embodiments described herein is omitted for sake of brevity. As shown in FIG. 3, the computer executable components 122 can further comprise artificial intelligence (A.I.) component 302, determination component 304, driving component 306, timer component 308, charging component 310, and/or location component 312.

In some embodiments, the execution component 204 can facilitate an action determined to mitigate further degradation of the battery 132 using artificial intelligence. Thus, according to an embodiment, the A.I. component 302 can determine the action (e.g., later discussed in greater detail) determined to mitigate further degradation of the battery 132 using a degradation response algorithm generated (e.g., by the A.I. component 302) using machine learning applied to past degradation of other batteries, other than the battery 132. In this regard, the A.I. component 302 can analyze past battery degradation and/or past battery health metrics in order to determine a health of the battery 132. Further, the A.I. component 302 can analyze past responses to battery degradation and past battery health metrics in order to determine optimal response actions to determined battery degradation. Data associated with past degradation of other batteries can be recorded and/or stored in the memory 118, or accessed via the communication unit 128 from a network 114. For example, the machine learning described herein can perform classifications, correlations, inferences and/or expressions associated with principles of artificial intelligence. For instance, machine learning techniques can employ an automatic classification system and/or an automatic classification. In one example, the one or more artificial intelligence techniques can employ a probabilistic and/or statistical-based analysis (e.g., factoring into the analysis utilities and costs) to learn and/or generate inferences. Additionally, the one or more artificial intelligence techniques can employ any suitable machine-learning based techniques, statistical-based techniques and/or probabilistic-based techniques, such as, but not limited to: expert systems, fuzzy logic, SVMs, Hidden Markov Models ("HMMs"), greedy search algorithms, rule-based systems, Bayesian models (e.g., Bayesian networks), neural networks, other non-linear training techniques, data fusion, utility-based analytical systems, systems employing Bayesian models, a combination thereof, and/or the like. In another aspect, the one or more artificial intelligence techniques can perform a set of machine learning computations, such as: a set of clustering machine learning computations; a set of logistic regression machine learning computations; a set of decision tree machine learning computations; a set of random forest machine learning computations; a set of regression tree machine learning computations; a set of least square machine learning computations, a set of instance-based machine learning computations; a set of regression machine learning computations; a set of support vector regression machine learning computations; a set of k-means machine learning computations; a set of spectral clustering machine learning computations; a set of rule learning machine learning computations, a set of Bayesian machine learning computations; a set of deep Boltzmann machine computations; a set of deep belief network computations; a set of different machine learning computations, a combination thereof and/or the like.

Figure 7:
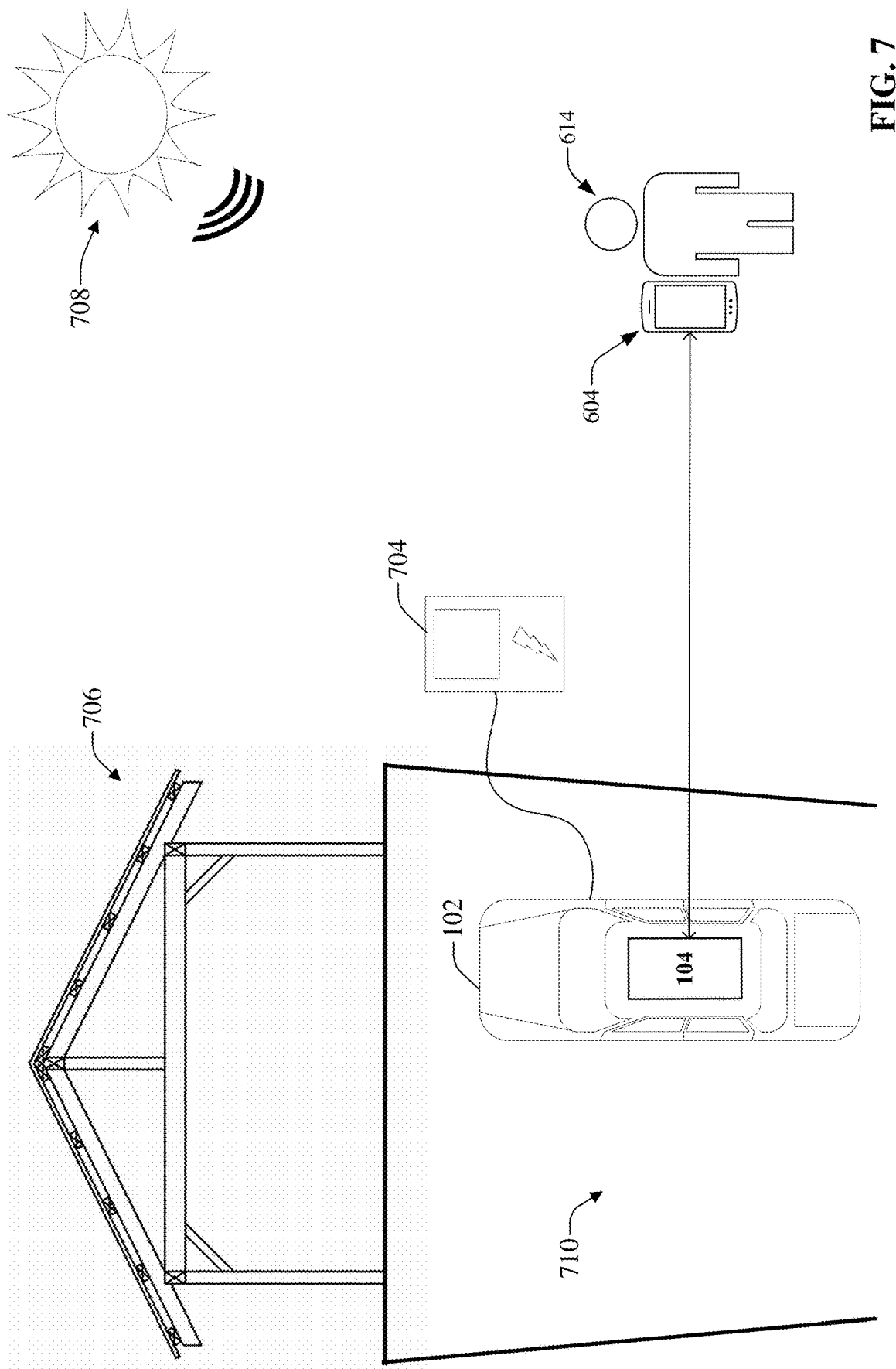
FIG. 7 illustrates a diagram of example, non-limiting vehicle scenarios in accordance with one or more embodiments described herein.

In some embodiments, the determination component 304 can (e.g., using a defined degradation determination algorithm) determine a cause for the degradation of the battery 132. In various implementations, the defined degradation determination algorithm can be generated (e.g., by the A.I. component 302) using machine learning applied to past responses to past degradation of other batteries, other than the battery. The determination component 304 can thus utilize the degradation determination algorithm and one or more battery health metrics as inputs in order to determination the cause for the degradation of the battery 132. In an example, the cause for the degradation of the battery can be determined (e.g., via the determination component 304, A.I. component 302, and/or battery health component 202) to comprise overheating of the battery 132 (e.g., from exposure of the vehicle 102 to sunlight) (e.g., from sun 708 as illustrated in FIG. 7). In this regard, the action determined (e.g., by the determination component 304, A.I. component 302, and/or battery health component 202) to mitigate further degradation of the battery 132 can comprise autonomously moving (e.g., using the driving component 306) the vehicle 102 away from the sunlight. To move the vehicle 102 away from the sunlight, the system 100 can identify a shaded area, such as parking structure 706 as illustrated in FIG. 7, that the vehicle 102 can autonomously navigate to. In other examples, the driving component 306 can move the vehicle 102 to a designated parking area (e.g., a work garage or a home parking garage). In another example, the cause for the degradation of the battery 132 can comprise overcharging of the battery 132 (e.g., from a charging station 704 as illustrated in FIG. 7) (e.g., as determined by the determination component 304, A.I. component 302, and/or battery health component 202). In this regard, the action determined (e.g., by the determination component 304, A.I. component 302, and/or battery health component 202) to mitigate further degradation of the battery 132 can comprise terminating (e.g., via the charging component 310) a charging operation of the battery 132. For example, the vehicle 102 can be charging vehicle a charger (e.g., a plug-in charger, onboard charger, a contact charger, or a wireless charger) (e.g., charging station 704 as illustrated in FIG. 7). The charging component 310 can thus terminate charging of the battery 132 by stopping the charging station 704 from supplying power to the vehicle 102, or electrically decouple the charging station 704 from the battery 132. In some implementations, the degradation of the battery 132 can comprise degradation of a cell of a multi-cell battery. In this regard, the charging component 310 can selectively prevent charging of the cell of the multi-cell battery. In further implementations, the battery 132 can comprise a battery pack (e.g., a solid-state battery pack). In this regard, the charging component 310 can, based on the degradation of the battery pack and a defined charging algorithm, selectively charge one or more portions of the battery pack.

In one or more embodiments, a traveling (e.g., walking) direction of a user (e.g., user 614) of the vehicle 102 can be utilized in a determination of an action executed by the system 100. Thus, according to an embodiment, the location component 312 can determine the traveling direction of the user of the vehicle 102 and/or a location of the vehicle 102. In various implementations, the location of the vehicle 102 can be determined using a GPS sensor of the vehicle 102. Further, the location of the user (e.g., user 614) of the vehicle 102 can be determined using a mobile device 604 of the user 614 (see, e.g., FIGS. 6 and 7). For instance, the mobile device 604 can collect location information (e.g., via a GPS and/or cellular radio of the mobile device 604) and send said information to the location component 312 (e.g., via the communication unit 128). Further, the mobile device 604 can follow one or more standard operating protocols (e.g., one or more entity defined permissions) to generate and/or send the location information without manual interference and/or assistance of an entity/user. In an example, the location component 312 can determine that the traveling direction of the user 614 is toward the vehicle 102. This can signify that the user 614 is walking toward the vehicle 102 (e.g., to use the vehicle 102). In this regard, the action determined to mitigate further degradation of the battery 132 can comprise preventing the vehicle 102 from moving from a current location (e.g., parking area 710), rather than moving the vehicle 102. For example, even though the vehicle 102 may be currently exposed to direct sunlight, and the user 614 walking toward the vehicle 102 can indicate that the user might be about to drive the vehicle 102, thus eliminating the need for the vehicle 102 to autonomously navigate away from direct sunlight. In an embodiment, the timer component 308 can determine whether an amount of time that a user 614 travels toward the vehicle 102 exceeds a defined time threshold. For example, the user 614 might be walking in the direction of the vehicle 102, but the user 614 does not intend to use the vehicle 102 (e.g., user 614 is walking toward a store that happens to be in the direction of the vehicle 102 with respect to the user 614). In this regard, the execution component 204 can enable autonomous movement of the vehicle 102 in response to the amount of time exceeding the defined threshold. Thus, the vehicle 102 can move to a shaded area in response to the amount of time exceeding the defined threshold. In another embodiment, the location component 312 can determine that the traveling direction of the user 614 is away from the vehicle 102. In this regard, the action determined to mitigate further degradation of the battery 132 can comprise moving the vehicle 102 from a current location (e.g., parking area 710) and into a shaded area (e.g., parking structure 706).

According to an embodiment, the degradation of the battery 132 can be determined (e.g., via the determination component 304, A.I. component 302, and/or battery health component 202) to be caused by speeding of the vehicle 102 (e.g., speeding determined to comprise excessive speed using a defined speed algorithm). In this regard, excessive acceleration, or speed of the vehicle 102 can lead to unnecessary degradation of the battery 132. Thus, the driving component 306 can, based on the degradation of the battery 132, limit a speed of the vehicle 102. It is noted that this speed or acceleration limitation can be overridden by a user of the vehicle 102 (e.g., via a user interface or infotainment system of the vehicle 102). For example, increased speed or acceleration may be deemed necessary by a user of the vehicle 102 to avoid a collision or mitigate an accident.

Figure 4:
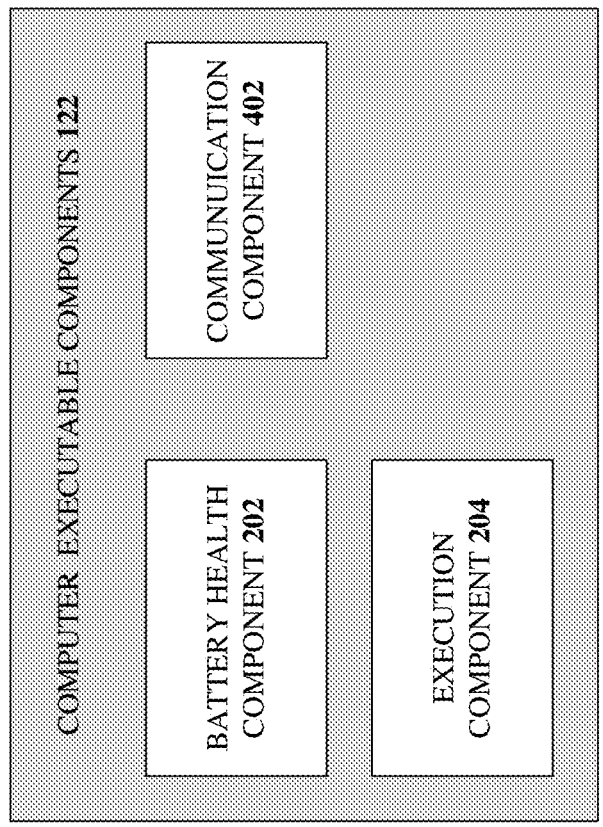
FIG. 4 illustrates a block diagram of example, non-limiting computer executable components in accordance with one or more embodiments described herein.

FIG. 4 illustrates a block diagram of example, non-limiting computer executable components 122 that can facilitate vehicle battery health optimization and communication in accordance with one or more embodiments described herein. Repetitive description of like elements employed in other embodiments described herein is omitted for sake of brevity. As shown in FIG. 4, the one or more computer executable components 122 can include battery health component 202, communication component 402, and/or execution component 204.

In various embodiments herein, the onboard vehicle system 104 can be configured to determine and/or monitor one or more battery health metrics of a battery 132 of a vehicle 102. In some embodiments, the battery 132 can in part, or in whole, comprise the system 104, though in other embodiments, the system 104 is external to the battery 132. According to an embodiment, the battery health component 202 can (e.g., using a defined battery health algorithm and/or a battery sensor) determine degradation of the battery 132 of the vehicle 102. In this regard, the vehicle electronic systems/devices 108 can comprise a battery sensor that can be utilized by the battery health component 202 to monitor and/or determine one or more battery health metrics represented in the battery health of the battery 132. In various embodiments, the battery health component 202 can determine a health of the battery 132 (e.g., such a state of age or degradation of the battery cell 132), according to one or more defined health metrics, based on an output of the battery sensor. In various embodiments, a defined health metric can comprise a difference between a previous impedance of the battery 132 and a current impedance of the battery 132. In further embodiments, the defined health metric can comprise a difference between an impedance of one cell of the battery 132 and a second cell of the battery 132 (e.g., of a common battery pack). In further embodiments, the defined health metric can be based on an output of the battery sensor (e.g., a voltage and/or a temperature). In this regard, the battery health component 202 can determine a health of the battery 132 based on an output of the battery sensor (e.g., according to a defined voltage and/or temperature metric).

In some embodiments, rather than performing an automation action, the system 100 can present a message representative of the degradation of the battery 132 to a user of the vehicle 102. Such a message can comprise a notification and/or one or more options, selectable by the user, that can be implemented by the system 100 in order to mitigate degradation of the battery 132. Thus, the communication component 402 can, based on the degradation of the battery 132 and/or a traveling direction of a user 614 of the vehicle 102, external to the vehicle 102, transmit a message representative of the degradation of the battery 132 (e.g., to one or more external devices or entities) (e.g., via the communication unit 128). In various implementations, the message can comprise a push notification (e.g., via a mobile application of a mobile device herein) a text message, an email, a phone call, a video message, voicemail, or another suitable message. The message can comprise one or more selectable options transmitted to a mobile device 604 associated with the user 614 (e.g., executable by the execution component 204) determined (e.g., via the battery health component 202) to mitigate further degradation of the battery 132. In this regard, the execution component 204 can facilitate an action (e.g., determined via the battery health component 202 to mitigate further degradation of the battery 132) based on a selection (e.g., by the user 614 via a mobile device 604) of one of the one or more selectable options, received via the communication component 402. In various implementations, the user 614 can select an option by tapping on an area of a touch screen of the mobile device 604 associated with the option (e.g., tapping an icon of a selectable option). In further embodiments, the message can be transmitted via an infotainment device 612 of the vehicle 102 (see, e.g., FIG. 6). In further embodiments, the message can comprise a haptic alert via a steering wheel 602 of the vehicle 102, an audible alert via a speaker 610 of the vehicle 102, or a different type of message, and the user 614 can provide an audible response (e.g., captured via a microphone of the vehicle 102). In various implementations, the message can increase in intensity over a defined period of time (e.g., via haptic vibration or sound) in response to the message not being acknowledged by the user 614 (e.g., via the mobile device 604, infotainment device 612, or via another suitable interface). It is noted that, in various embodiments, the message can be transmitted to/from an external device (e.g., a mobile device) and a vehicle 102 via a vehicle-to-everything (V2X) communication protocol.

In another embodiment, the message can be transmitted to a service center entity (e.g., to an external device 112 associated with the service center entity) associated with the vehicle 102. In this regard, the vehicle 102 can be registered with a service center (e.g., a repair center). The foregoing can provide the service center entity insight into the health of the battery 132 and/or actions taken to mitigate battery degradation in advance of service of the vehicle 102 at the service center entity. For example, a defined warranty algorithm can be utilized (e.g., by the system 100) in order to determine whether action(s) taken by the user 614 to mitigate battery 132 degradation (e.g., over a defined period of time) keep the vehicle 102 and/or battery 132 within warranty compliance, or outside of warranty compliance.

In various embodiments, the system 100 can identify mobile device connected to the vehicle 102 and/or most recently connected to the vehicle 102, and identify the user(s) to that should receive these messages (e.g., user(s) that can execute an action intended to mitigate battery degradation). Thus, a user can be selected by whichever mobile device (associated with a user) was last connected the vehicle 102, the last vehicle 102 key fob (e.g., associated with a user) to use the vehicle 102, the last user profile to use the vehicle 102, and/or last or most recent user can be sent the messages first. Then, if the first user does not respond, the system 100 can move to a second user (e.g., next most recent user, vehicle 102 owner, co-owner, etc.). Thus, in some embodiments, the user 614 can comprise a first user (e.g., a most recent operator of the vehicle 102). In this regard, the communication component 402 can transmit the message to a second user (e.g., user 618) of the vehicle 102 in response to not receiving (e.g., via the communication component 402) selection of a selectable option of the one or more selectable options within a defined amount of time (e.g., as measured via the timer component 308).

Figure 5:
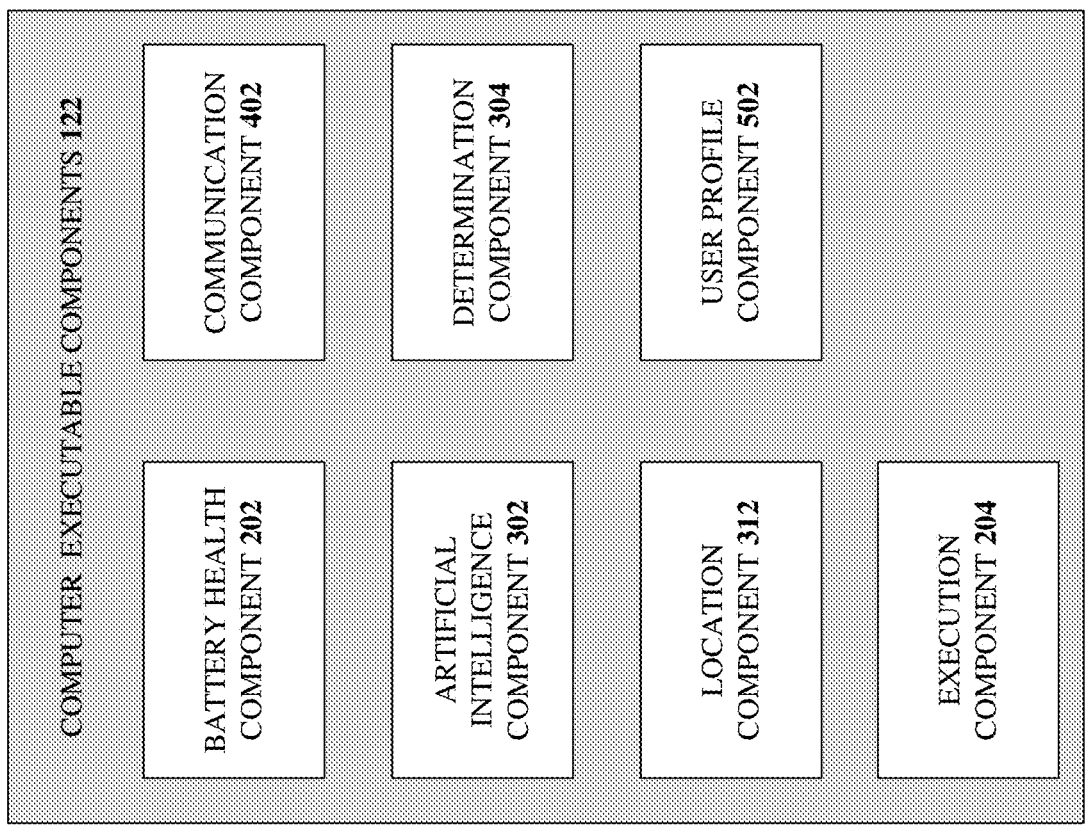
FIG. 5 illustrates a block diagram of example, non-limiting computer executable components in accordance with one or more embodiments described herein.

FIG. 5 illustrates a block diagram of example, non-limiting computer executable components 122 that can facilitate vehicle battery health optimization and communication in accordance with one or more embodiments described herein. Repetitive description of like elements employed in other embodiments described herein is omitted for sake of brevity. As shown in FIG. 5, the computer executable components 122 can further comprise A.I. component 302, determination component 304, location component 312, and/or user profile component 502.

According to an embodiment, the A.I. component 302 can determine the one or more selectable options using a degradation response algorithm generated, by the A.I. component 302, using machine learning applied to past degradation of other batteries, other than the battery 132 and/or past selectable options. In this regard, the A.I. component 302 can analyze past battery degradation and/or past battery health metrics in order to determine the selectable options (e.g., options that, when implemented, can be utilized to mitigate battery 132 degradation). Further, the A.I. component 302 can analyze past response actions to battery 132 degradation and past battery health metrics in order to determine optimal responses to determined battery degradation. Data associated with past degradation of other batteries can be recorded and/or stored in the memory 118, or accessed via the communication unit 128 from a network 114.

In some embodiments, the determination component 304 can (e.g., using a defined degradation determination algorithm) determine a cause for the degradation of the battery 132. In various implementations, the defined degradation determination algorithm can be generated (e.g., by the A.I. component 302) using machine learning applied to past response actions to past degradation of other batteries, other than the battery. The determination component 304 can thus utilize the degradation determination algorithm and one or more battery health metrics as inputs in order to determine the cause for the degradation of the battery 132. In an example, the cause for the degradation of the battery can be determined (e.g., via the determination component 304, A.I. component 302, and/or battery health component 202) to comprise overheating of the battery 132 (e.g., from exposure of the vehicle 102 to sunlight) (e.g., from sun 708 as illustrated in FIG. 7). In this regard, the selectable options determined (e.g., by the determination component 304, A.I. component 302, and/or battery health component 202) to mitigate further degradation of the battery 132 can comprise autonomously moving (e.g., using the driving component 306) the vehicle 102 away from the sunlight. To move the vehicle 102 away from the sunlight, the system 100 can identify a shaded area, such as parking structure 706, as illustrated in FIG. 7, that the vehicle 102 can autonomously navigate to (e.g., in response to selection of a selectable options by a user). In other examples, based upon selection of a selectable option, the driving component 306 can move the vehicle 102 to a designated parking area (e.g., a work garage or a home parking garage). In another example, the cause for the degradation of the battery 132 can comprise overcharging of the battery 132 (e.g., from a charging station 704 as illustrated in FIG. 7) (e.g., as determined by the determination component 304, A.I. component 302, and/or battery health component 202). In this regard, a selectable option determined (e.g., by the determination component 304, A.I. component 302, and/or battery health component 202) to mitigate further degradation of the battery 132 can comprise terminating (e.g., via the charging component 310) a charging operation of the battery 132. For example, the vehicle 102 can be charging vehicle a charger (e.g., a plug-in charger, onboard charger, a contact charger, or a wireless charger) (e.g., charging station 704 as illustrated in FIG. 7). The charging component 310 can thus, in response to selection of a corresponding selectable option, terminate charging of the battery 132 by stopping charging station 704 from supplying power to the vehicle 102, or electrically decouple the charging station 704 from the battery 132.

According to an embodiment, the location component 312 can determine a traveling (e.g., walking) direction of the user (e.g., user 614) and/or a location of the vehicle 102. In various implementations, the location of the vehicle 102 can be determined using a GPS sensor of the vehicle 102. Further, the location of the user (e.g., user 614) of the vehicle 102 can be determined using a mobile device 604 of the user 614. For instance, the mobile device 604 can collect location information (e.g., via a GPS) and send said information to the location component 312. Further, the mobile device 604 can follow one or more standard operating protocols (e.g., one or more entity defined permissions) to generate and/or send the location information without manual interference and/or assistance of an entity/user. In an example, the location component 312 can determine that the traveling direction of the user 614 is toward the vehicle 102. This can signify that the user 614 is walking toward the vehicle 102 (e.g., to use the vehicle 102). In this regard, an action determined to mitigate further degradation of the battery 132 can comprise preventing transmission of the message. For example, even though the vehicle 102 may be currently exposed to direct sunlight, the user 614 walking toward the vehicle 102 can indicate that the user might be about to drive the vehicle 102, thus eliminating the need for the vehicle 102 to provide selectable options to the user 614.

In various embodiments, the system 100 can identify mobile device connected to the vehicle 102 and/or most recently connected to the vehicle 102, and identify the user(s) to that should receive messages (e.g., user(s) that can affect an action intended to mitigate battery degradation). Thus, a user can be selected by whichever mobile device (associated with a user) was last connected the vehicle 102, the last vehicle 102 key fob (e.g., associated with a user) to use the vehicle 102, the last user profile to use the vehicle 102, and last or most recent user can be sent the messages first (e.g., via the communication component 402). Then, if the first user does not respond, the system 100 can move to second user (e.g., next most recent user, vehicle 102 owner, co-owner, etc.). Thus, in some embodiments, the user 614 can comprise a first user (e.g., a most recent operator of the vehicle 102). In this regard, the communication component 402 can transmit the message to a second user (e.g., user 618) of the vehicle 102 in response to not receiving selection of a selectable option of the one or more selectable options within a defined amount of time (e.g., as measured via the timer component 308). In further embodiments, user(s) herein can be associated with one or more user profiles registered (e.g., via the user profile component 502) with the vehicle 102. In this regard, users can register (e.g., via the user profile component 502 and/or via input device 106) user profiles with the system 100. Such user profiles can comprise defined contact methods and/or preferences for respective profiles (e.g., for messages herein) and can be stored (e.g., by the user profile component 502) in memory 118 or over a network 114. In this regard, a message can be transmitted (e.g., via the communication component 402) based on the user profile (e.g., and corresponding contact method). Such a contact method can comprise push notification (e.g., via a mobile application of a mobile device herein) a text message, an email, a phone call, a video message, voicemail, or another suitable contact method for a message herein.

In some embodiments, the selectable options can comprise an option that would be detrimental to battery degradation (e.g., do nothing to mitigate). Other selectable options can comprise lowering a charging rate (e.g., via charging component 310) of charging station 704, enabling air conditioning or a cooling system for the battery 132, moving vehicle 102 (e.g., via the driving component 306), or other suitable selectable options for actions or inactions.

Figure 6:
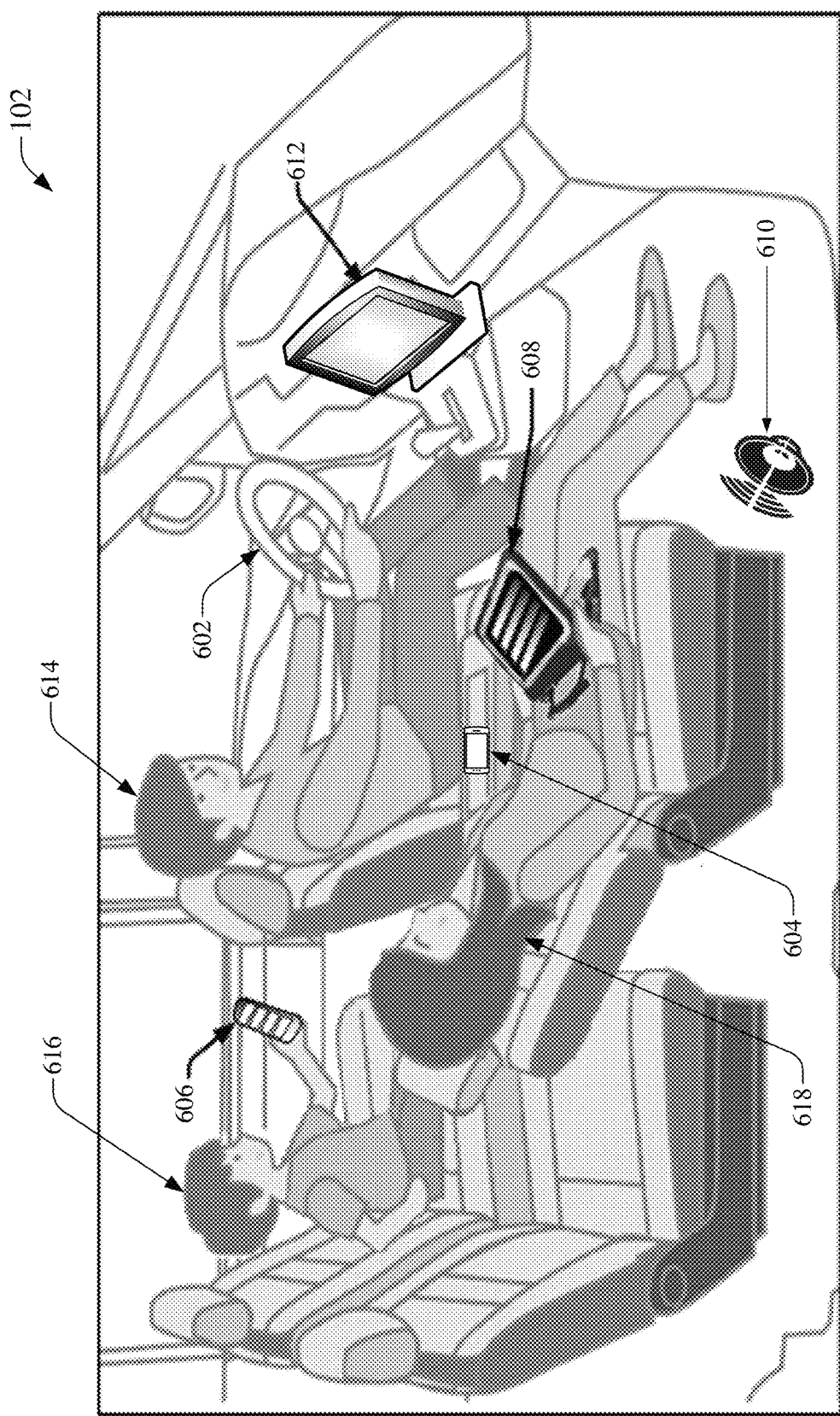
FIG. 6 illustrates a diagram of an example, non-limiting vehicle interior in accordance with one or more embodiments described herein.

FIG. 6 illustrates a diagram of an example, non-limiting vehicle 102 interior in accordance with one or more embodiments described herein. Repetitive description of like elements employed in other embodiments described herein is omitted for sake of brevity. As shown in FIG. 6, a user 614 (e.g., an operator) can steer the vehicle 102 using steering wheel 602. User 614 can be associated with (e.g., an owner of and/or registered with) mobile device 604. Likewise, user 616 can be associated with mobile device 606, and user 618 can be associated with mobile device 608. Further, each user can comprise a respective user profile registered (e.g., via the user profile component 502) with the system 100 and/or vehicle 102. In various embodiments, the vehicle 102 can comprise infotainment device 612 and/or speaker 610, which can be utilized by one or more users to interface with the vehicle 102. The infotainment device 612 can comprise a touch screen on which a user can interface with the system 100. Further, the speaker 610 can broadcast audible messages generated using the communication component 402.

Figure 8:
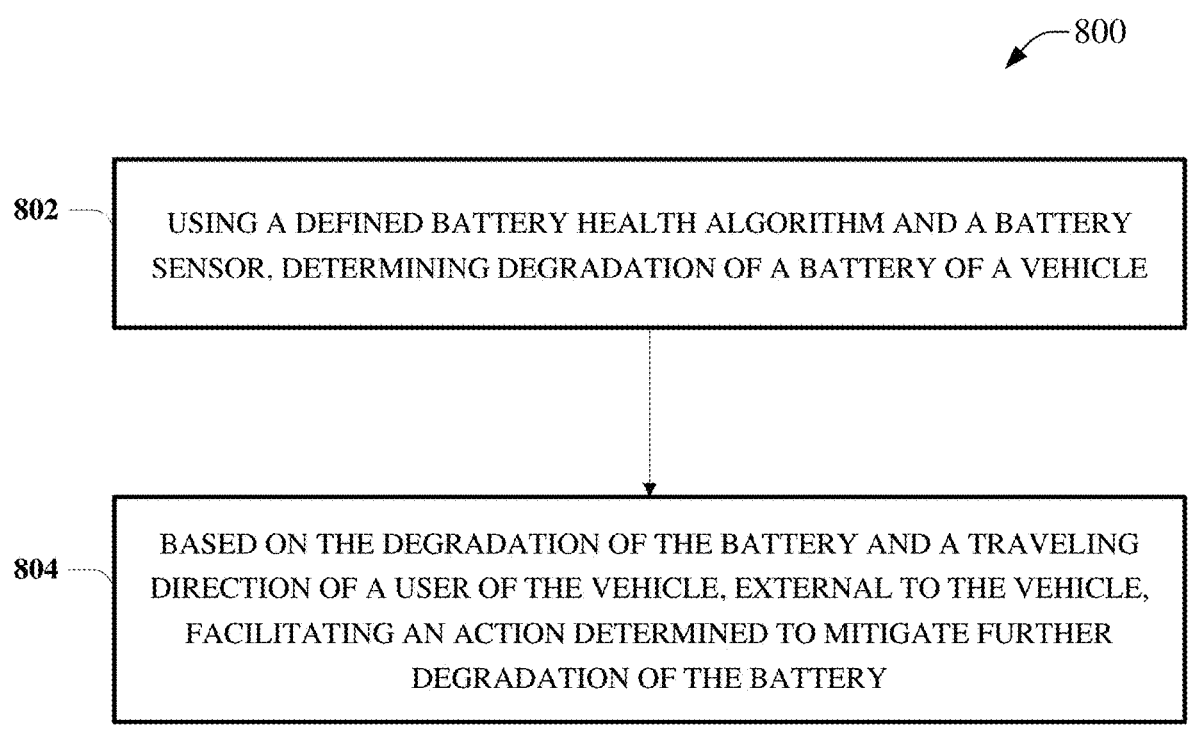
FIG. 8 illustrates a block flow diagram for a process associated with automated vehicle battery health optimization in accordance with one or more embodiments described herein.

FIG. 7 illustrates a diagram of example, non-limiting vehicle scenario(s) in accordance with one or more embodiments described herein. In some scenarios, as illustrated in FIG. 7, vehicle 102 can be parked in parking area 710, adjacent to parking structure 706. The parking area 710 may be exposed to direct sunlight from sun 708, while the parking structure 706 can comprise a shaded parking area. In another scenario, the vehicle 102 can be charged via the charging station 704. The charging station 704 can comprise a level 1, level 2, or level 3 charger, or can comprise another suitable type of charger for a vehicle 102. In various embodiments, the location of the user 614 with respect to the vehicle 102 (e.g., and/or corresponding direction of travel of the user 614) can be determined (e.g., via the location component 312) via the mobile device 604 associated with the user 614. As depicted in FIG. 7, the mobile device 604 can be communicatively coupled to the system 100 (e.g., directly and/or over a cellular network), FIG. 8 illustrates a block flow diagram for a process 800 associated with automated vehicle battery health optimization in accordance with one or more embodiments described herein. At 802, the process 800 can comprise, using a defined battery health algorithm and a battery sensor, determining (e.g., via the battery health component 202) degradation of a battery 132 of a vehicle 102. In this regard, the vehicle electronic systems/devices 108 can comprise a battery sensor that can be utilized by the battery health component 202 to monitor and/or determine one or more battery health metrics represented in the battery health of the battery 132. In various embodiments, the battery health component 202 can determine a health of the battery 132 (e.g., such a state of age or degradation of the battery cell 132), according to one or more defined health metrics, based on an output of the battery sensor. In various embodiments, a defined health metric can comprise a difference between a previous impedance of the battery 132 and a current impedance of the battery 132. In further embodiments, the defined health metric can comprise a difference between an impedance of one cell of the battery 132 and a second cell of the battery 132 (e.g., of a common battery pack). In further embodiments, the defined health metric can be based on an output of the battery sensor (e.g., a voltage and/or a temperature). In this regard, the battery health component 202 can determine a health of the battery 132 based on an output of the battery sensor (e.g., according to a defined voltage and/or temperature metric). At 804, the process 800 can comprise, based on the degradation of the battery 132 and a traveling direction of a user 614 of the vehicle 102, external to the vehicle 102, facilitating (e.g., via the execution component 204) an action determined to mitigate further degradation of the battery 132 (e.g., moving the vehicle 102, presenting movement of the vehicle 102, or another suitable action).

Figure 9:
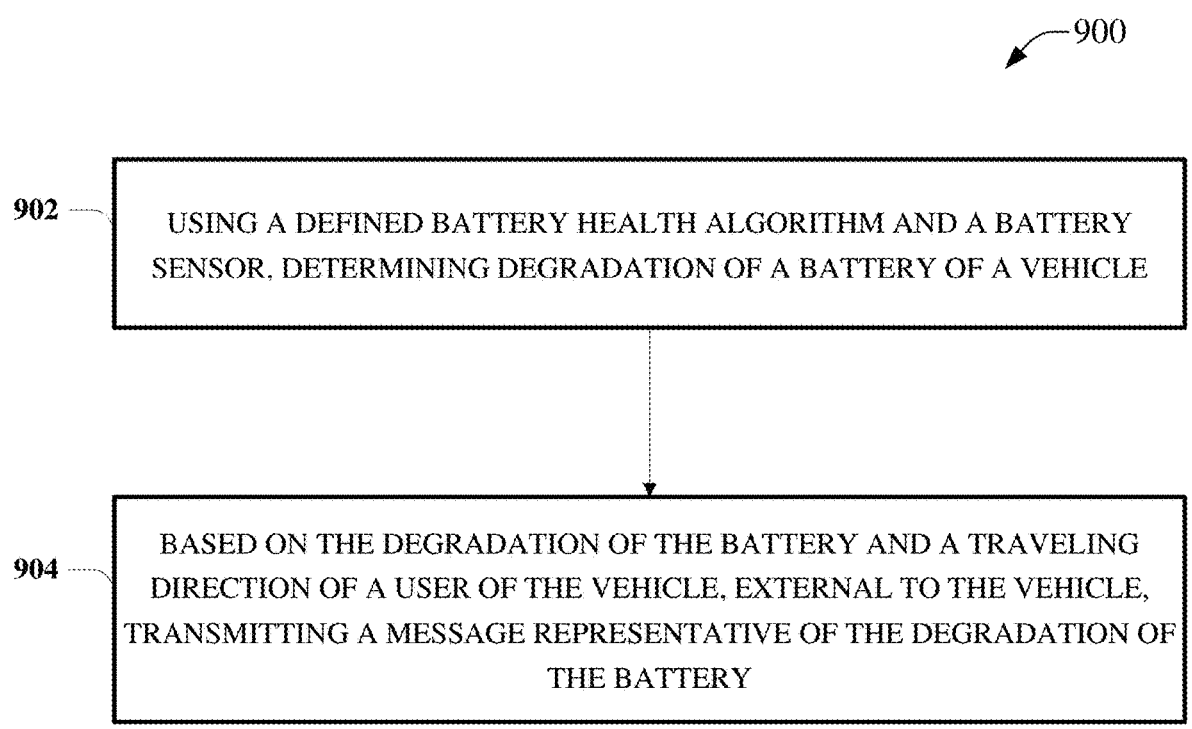
FIG. 9 illustrates a block flow diagram for a process associated with vehicle battery health optimization and communication in accordance with one or more embodiments described herein.

FIG. 9 illustrates a block flow diagram for a process 900 associated with vehicle battery health optimization and communication in accordance with one or more embodiments described herein. At 902, the process 900 can comprise, using a defined battery health algorithm and a battery sensor, determining (e.g., via the battery health component 202) degradation of a battery 132 of a vehicle 102. At 904, the process 900 can comprise, based on the degradation of the battery 132 and a traveling direction of a user 614 of the vehicle 102, external to the vehicle 102, transmitting (e.g., via the communication component 402) a message representative of the degradation of the battery 132.

Systems described herein can be coupled (e.g., communicatively, electrically, operatively, optically, inductively, acoustically, etc.) to one or more local or remote (e.g., external) systems, sources, and/or devices (e.g., electronic control systems (ECU), classical and/or quantum computing devices, communication devices, etc.). For example, system 100 (or other systems, controllers, processors, etc.) can be coupled (e.g., communicatively, electrically, operatively, optically, etc.) to one or more local or remote (e.g., external) systems, sources, and/or devices using a data cable (e.g., High-Definition Multimedia Interface (HDMI), recommended standard (RS), Ethernet cable, etc.) and/or one or more wired networks described below.

In some embodiments, systems herein can be coupled (e.g., communicatively, electrically, operatively, optically, inductively, acoustically, etc.) to one or more local or remote (e.g., external) systems, sources, and/or devices (e.g., electronic control units (ECU), classical and/or quantum computing devices, communication devices, etc.) via a network. In these embodiments, such a network can comprise one or more wired and/or wireless networks, including, but not limited to, a cellular network, a wide area network (WAN) (e.g., the Internet), and/or a local area network (LAN). For example, system 100 can communicate with one or more local or remote (e.g., external) systems, sources, and/or devices, for instance, computing devices using such a network, which can comprise virtually any desired wired or wireless technology, including but not limited to: powerline ethernet, VHF, UHF, AM, wireless fidelity (Wi-Fi), BLUETOOTH®, fiber optic communications, global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, Session Initiation Protocol (SIP), ZIGBEE®, RF4CE protocol, WirelessHART protocol, L-band voice or data information, 6LoWPAN (IPv6 over Low power Wireless Area Networks), Z-Wave, an ANT, an ultra-wideband (UWB) standard protocol, and/or other proprietary and non-proprietary communication protocols. In this example, system 100 can thus include hardware (e.g., a central processing unit (CPU), a transceiver, a decoder, an antenna (e.g., a ultra-wideband (UWB) antenna, a BLUETOOTH® low energy (BLE) antenna, etc.), quantum hardware, a quantum processor, etc.), software (e.g., a set of threads, a set of processes, software in execution, quantum pulse schedule, quantum circuit, quantum gates, etc.), or a combination of hardware and software that facilitates communicating information between a system herein and remote (e.g., external) systems, sources, and/or devices (e.g., computing and/or communication devices such as, for instance, a smart phone, a smart watch, wireless earbuds, etc.).

System herein can comprise one or more computer and/or machine readable, writable, and/or executable components and/or instructions that, when executed by processor (e.g., a processing unit 116 which can comprise a classical processor, a quantum processor, etc.), can facilitate performance of operations defined by such component(s) and/or instruction(s). Further, in numerous embodiments, any component associated with a system herein, as described herein with or without reference to the various figures of the subject disclosure, can comprise one or more computer and/or machine readable, writable, and/or executable components and/or instructions that, when executed by a processor, can facilitate performance of operations defined by such component(s) and/or instruction(s). Consequently, according to numerous embodiments, system herein and/or any components associated therewith as disclosed herein, can employ a processor (e.g., processing unit 116) to execute such computer and/or machine readable, writable, and/or executable component(s) and/or instruction(s) to facilitate performance of one or more operations described herein with reference to system herein and/or any such components associated therewith.

Systems herein can comprise any type of system, device, machine, apparatus, component, and/or instrument that comprises a processor and/or that can communicate with one or more local or remote electronic systems and/or one or more local or remote devices via a wired and/or wireless network. All such embodiments are envisioned. For example, a system (e.g., a system 100 or any other system or device described herein) can comprise a computing device, a general-purpose computer, field-programmable gate array, AI accelerator application-specific integrated circuit, a special-purpose computer, an onboard computing device, a communication device, an onboard communication device, a server device, a quantum computing device (e.g., a quantum computer), a tablet computing device, a handheld device, a server class computing machine and/or database, a laptop computer, a notebook computer, a desktop computer, wearable device, Internet of things device, a cell phone, a smart phone, a consumer appliance and/or instrumentation, an industrial and/or commercial device, a digital assistant, a multimedia Internet enabled phone, a multimedia players, and/or another type of device.

Figure 10:
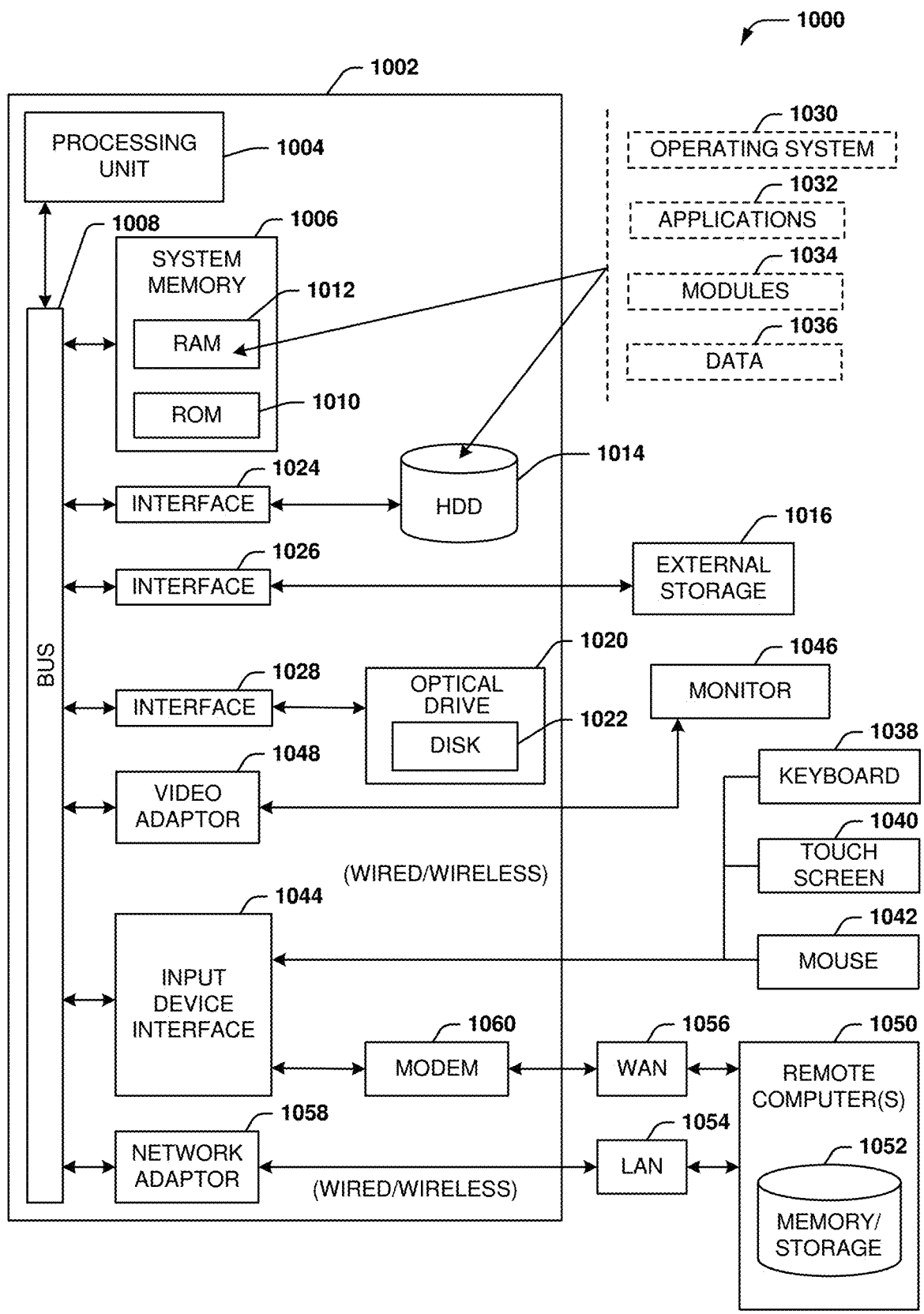
FIG. 10 is an example, non-limiting computing environment in which one or more embodiments described herein can be implemented.

In order to provide additional context for various embodiments described herein, FIG. 10 and the following discussion are intended to provide a brief, general description of a suitable computing environment 1000 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the various methods can be practiced with other computer system configurations, including single-processor or multiprocessor computer systems, minicomputers, mainframe computers, Internet of Things (IoT) devices, distributed computing systems, as well as personal computers (e.g., ruggedized personal computers), field-programmable gate arrays, handheld computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data, or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory, or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries, or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, optic, infrared, and other wireless media.

With reference again to FIG. 10, the example environment 1000 for implementing various embodiments of the aspects described herein includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors, field-programmable gate array, AI accelerator application-specific integrated circuit, or other suitable processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system (BIOS) can be stored in a non-volatile memory such as ROM, erasable programmable read only memory (EPROM), EEPROM, which BIOS contains the basic routines that help to transfer information between elements within the computer 1002, such as during startup. The RAM 1012 can also include a high-speed RAM such as static RAM for caching data. It is noted that unified Extensible Firmware Interface(s) can be utilized herein.

The computer 1002 further includes an internal hard disk drive (HDD) 1014 (e.g., EIDE, SATA), one or more external storage devices 1016 (e.g., a magnetic floppy disk drive (FDD) 1016, a memory stick or flash drive reader, a memory card reader, etc.) and an optical disk drive 1020 (e.g., which can read or write from a CD-ROM disc, a DVD, a BD, etc.). While the internal HDD 1014 is illustrated as located within the computer 1002, the internal HDD 1014 can also be configured for external use in a suitable chassis (not shown). Additionally, while not shown in environment 1000, a solid-state drive (SSD) could be used in addition to, or in place of, an HDD 1014. The HDD 1014, external storage device(s) 1016 and optical disk drive 1020 can be connected to the system bus 1008 by an HDD interface 1024, an external storage interface 1026 and an optical drive interface 1028, respectively. The interface 1024 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine (VM) of multiple VMs hosted at computer 1002. Furthermore, operating system 1030 can provide runtime environments, such as the Java runtime environment or the .NET framework, for applications 1032. Runtime environments are consistent execution environments that allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and settings for an application.

Further, computer 1002 can be enabled with a security module, such as a trusted processing module (TPM). For instance, with a TPM, boot components hash next in time boot components, and wait for a match of results to secured values, before loading a next boot component. This process can take place at any layer in the code execution stack of computer 1002, e.g., applied at the application execution level or at the operating system (OS) kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1044 that can be coupled to the system bus 1008, but can be connected by other interfaces, such as a parallel port, an IEEE 1394 serial port, a game port, a USB port, an IR interface, a BLUETOOTH® interface, etc.

A monitor 1046 or other type of display device can be also connected to the system bus 1008 via an interface, such as a video adapter 1048. In addition to the monitor 1046, a computer typically includes other peripheral output devices (not shown), such as speakers, printers, etc.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1052 is illustrated. The logical connections depicted include wired/wireless connectivity to a local area network (LAN) 1054 and/or larger networks, e.g., a wide area network (WAN) 1056. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 can be connected to the local network 1054 through a wired and/or wireless communication network interface or adapter 1058. The adapter 1058 can facilitate wired or wireless communication to the LAN 1054, which can also include a wireless access point (AP) disposed thereon for communicating with the adapter 1058 in a wireless mode.

When used in a WAN networking environment, the computer 1002 can include a modem 1060 or can be connected to a communications server on the WAN 1056 via other means for establishing communications over the WAN 1056, such as by way of the Internet. The modem 1060, which can be internal or external and a wired or wireless device, can be connected to the system bus 1008 via the input device interface 1044. In a networked environment, program modules depicted relative to the computer 1002 or portions thereof, can be stored in the remote memory/storage device 1052. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 11:
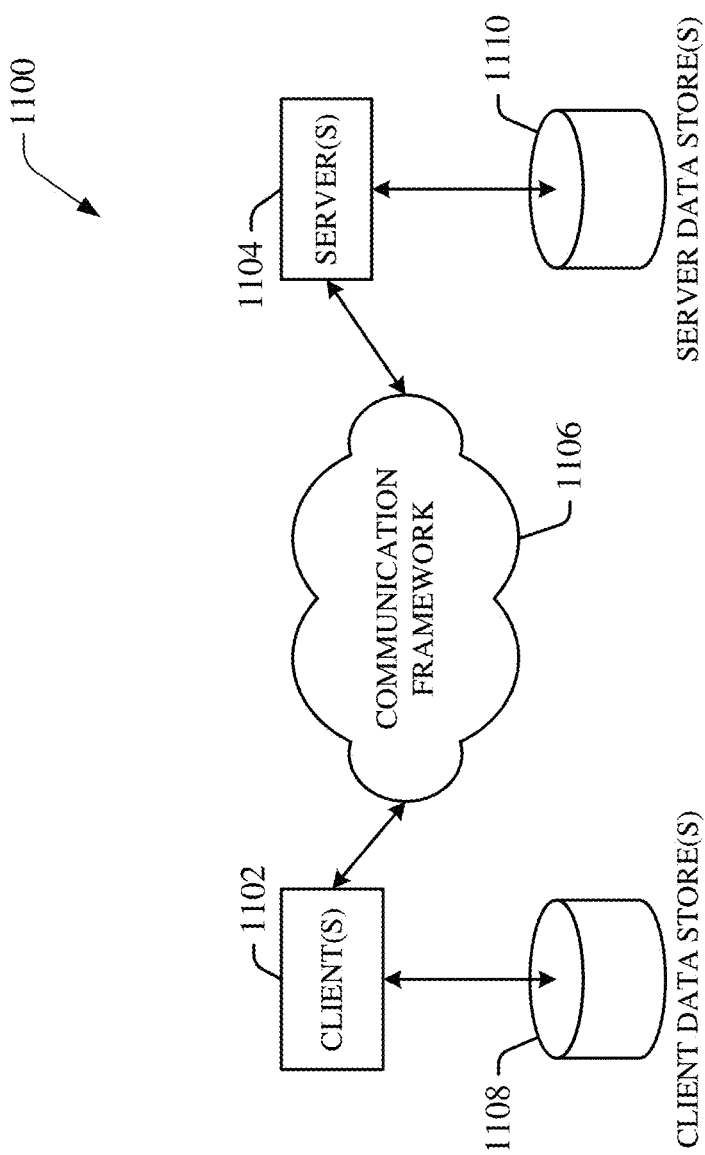
FIG. 11 is an example, non-limiting networking environment in which one or more embodiments described herein can be implemented.

Referring now to FIG. 11, there is illustrated a schematic block diagram of a computing environment 1100 in accordance with this specification. The system 1100 includes one or more client(s) 1102, (e.g., computers, smart phones, tablets, cameras, PDA's). The client(s) 1102 can be hardware and/or software (e.g., threads, processes, computing devices). The client(s) 1102 can house cookie(s) and/or associated contextual information by employing the specification, for example.

The system 1100 also includes one or more server(s) 1104. The server(s) 1104 can also be hardware or hardware in combination with software (e.g., threads, processes, computing devices). The servers 1104 can house threads to perform transformations of media items by employing aspects of this disclosure, for example. One possible communication between a client 1102 and a server 1104 can be in the form of a data packet adapted to be transmitted between two or more computer processes wherein data packets may include coded analyzed headspaces and/or input. The data packet can include a cookie and/or associated contextual information, for example. The system 1100 includes a communication framework 1106 (e.g., a global communication network such as the Internet) that can be employed to facilitate communications between the client(s) 1102 and the server(s) 1104.

Communications can be facilitated via a wired (including optical fiber) and/or wireless technology. The client(s) 1102 are operatively connected to one or more client data store(s) 1108 that can be employed to store information local to the client(s) 1102 (e.g., cookie(s) and/or associated contextual information). Similarly, the server(s) 1104 are operatively connected to one or more server data store(s) 1110 that can be employed to store information local to the servers 1104. Further, the client(s) 1102 can be operatively connected to one or more server data store(s) 1110.

In one exemplary implementation, a client 1102 can transfer an encoded file, (e.g., encoded media item), to server 1104. Server 1104 can store the file, decode the file, or transmit the file to another client 1102. It is noted that a client 1102 can also transfer uncompressed file to a server 1104 and server 1104 can compress the file and/or transform the file in accordance with this disclosure. Likewise, server 1104 can encode information and transmit the information via communication framework 1106 to one or more clients 1102.

The illustrated aspects of the disclosure can also be practiced in distributed computing environments where certain tasks are performed by remote processing devices that are linked through a communications network. In a distributed computing environment, program modules can be located in both local and remote memory storage devices.

The above description includes non-limiting examples of the various embodiments. It is, of course, not possible to describe every conceivable combination of components or methods for purposes of describing the disclosed subject matter, and one skilled in the art can recognize that further combinations and permutations of the various embodiments are possible. The disclosed subject matter is intended to embrace all such alterations, modifications, and variations that fall within the spirit and scope of the appended claims.

With regard to the various functions performed by the above-described components, devices, circuits, systems, etc., the terms (including a reference to a "means") used to describe such components are intended to also include, unless otherwise indicated, any structure(s) which performs the specified function of the described component (e.g., a functional equivalent), even if not structurally equivalent to the disclosed structure. In addition, while a particular feature of the disclosed subject matter may have been disclosed with respect to only one of several implementations, such feature can be combined with one or more other features of the other implementations as may be desired and advantageous for any given or particular application.

The terms "exemplary" and/or "demonstrative" as used herein are intended to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent structures and techniques known to one skilled in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The term "or" as used herein is intended to mean an inclusive "or" rather than an exclusive "or." For example, the phrase "A or B" is intended to include instances of A, B, and both A and B. Additionally, the articles "a" and "an" as used in this application and the appended claims should generally be construed to mean "one or more" unless either otherwise specified or clear from the context to be directed to a singular form.

The term "set" as employed herein excludes the empty set, i.e., the set with no elements therein. Thus, a "set" in the subject disclosure includes one or more elements or entities. Likewise, the term "group" as utilized herein refers to a collection of one or more entities.

The description of illustrated embodiments of the subject disclosure as provided herein, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as one skilled in the art can recognize. In this regard, while the subject matter has been described herein in connection with various embodiments and corresponding drawings, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

Further aspects of the invention are provided by the subject matter of the following clauses:

1. A system, comprising:
   a memory that stores computer executable components; and
   a processor that executes the computer executable components stored in the memory, wherein the computer executable components comprise:
   a battery health component that, using a defined battery health algorithm and a battery sensor, determines degradation of a battery of a vehicle; and
   an execution component that, based on the degradation of the battery and a traveling direction of a user of the vehicle, external to the vehicle, facilitates an action determined to mitigate further degradation of the battery.

2. The system of any preceding clause, wherein the computer executable components further comprise:
   an artificial intelligence component that determines the action determined to mitigate further degradation of the battery using a degradation response algorithm generated, by the artificial intelligence component, using machine learning applied to past degradation of other batteries, other than the battery.

3. The system of any preceding clause, wherein the computer executable components further comprise:
   a determination component that, using a defined degradation determination algorithm, determines a cause for the degradation of the battery.

4. The system of any preceding clause, wherein the defined degradation determination algorithm is generated, by an artificial intelligence component, using machine learning applied to past responses to past degradation of other batteries, other than the battery.

5. The system of any preceding clause, wherein the cause for the degradation of the battery comprises overheating of the battery from exposure of the vehicle to sunlight, and wherein the action comprises autonomously moving the vehicle away from the sunlight.

6. The system of any preceding clause, wherein the cause for the degradation of the battery comprises overcharging of the battery, and wherein the action comprises terminating a charging operation of the battery.

7. The system of any preceding clause, wherein the computer executable components further comprise:
   a location component that determines the traveling direction of the user of the vehicle.

8. The system of any preceding clause, wherein the location component determines that the traveling direction of the user is toward the vehicle, and wherein the action comprises preventing the vehicle from moving from a current location.

9. The system of any preceding clause, wherein the computer executable components further comprise:
   a timer component that determines whether an amount of time that a user travels toward the vehicle exceeds a defined threshold, wherein the execution component enables autonomous movement of the vehicle in response to the amount of time exceeding the defined threshold.

10. The system of any preceding clause, wherein the location component determines that the traveling direction of the user is away from the vehicle, and wherein the action comprises moving the vehicle from a current location.

11. The system of any preceding clause, wherein the vehicle comprises an electric automobile.

12. The system of any preceding clause, wherein the vehicle comprises an electric scooter or an electric bicycle.

13. The system of clause 1 above with any set of combinations of the systems 2-12 above.

14. A non-transitory machine-readable medium, comprising executable instructions that, when executed by a processor, facilitate performance of operations, comprising:
   using a defined battery health algorithm and a battery sensor, determining degradation of a battery of a vehicle; and
   based on the degradation of the battery and a traveling direction of a user of the vehicle, external to the vehicle, facilitating an action determined to mitigate further degradation of the battery.

15. The non-transitory machine-readable medium of any preceding clause, wherein the battery comprises a solid-state battery.

16. The non-transitory machine-readable medium of any preceding clause, wherein the battery comprises a multi-cell battery.

17. The non-transitory machine-readable medium of any preceding clause, wherein the degradation of the battery comprises degradation of a cell of the multi-cell battery wherein the operations further comprise:
   preventing charging of the cell of the multi-cell battery.

18. The non-transitory machine-readable medium of any preceding clause, wherein the degradation of the battery is determined to be caused by speeding of the vehicle, and wherein the operations further comprise:
   based on the degradation of the battery, limiting a speed of the vehicle.

19. The non-transitory machine-readable medium of clause 14 above with any set of combinations of the non-transitory machine-readable mediums 15-18 above.

20. A method, comprising:
using a defined battery health algorithm and a battery sensor, determining, by a system comprising a processor, degradation of a battery of a vehicle; and
based on the degradation of the battery and a traveling direction of a user of the vehicle, external to the vehicle, facilitating, by the system, an action determined to mitigate further degradation of the battery.

21. The method of any preceding clause, wherein the battery comprises a battery pack, and wherein the action comprises, based on the degradation of the battery pack and a defined charging algorithm, selectively charging one or more portions of the battery pack.

22. The method of any preceding clause, wherein the vehicle comprises an autonomous car.

23. The method of clause 20 above with any set of combinations of the methods of clauses 21-22 above.

What is claimed is:

1. A system, comprising:
a memory that stores computer executable components; and
a processor that executes the computer executable components stored in the memory, wherein the computer executable components comprise:
a battery health component that, using a defined battery health algorithm and a battery sensor, determines degradation of a battery of a vehicle; and
an execution component that mitigates further degradation of the battery by performing action selected based on the degradation of the battery and a traveling direction of a user of the vehicle relative to a current location of the vehicle, wherein the user is outside of the vehicle, wherein a cause of the degradation of the battery comprises overheating of the battery from exposure of the vehicle to sunlight in the current location, and wherein the action comprises autonomously moving the vehicle to a different location that is away from the sunlight.

2. The system of claim 1, wherein the computer executable components further comprise:
an artificial intelligence component that determines the action by using a degradation response algorithm based on past degradation of other batteries, other than the battery.

3. The system of claim 1, wherein the computer executable components further comprise:
a determination component that, using a defined degradation determination algorithm, determines the cause of the degradation of the battery.

4. The system of claim 3, wherein the defined degradation determination algorithm is generated, by an artificial intelligence component, using machine learning applied to past responses to past degradation of other batteries, other than the battery.

5. The system of claim 1, wherein the cause of the degradation of the battery further comprises overcharging of the battery, and wherein the action further comprises terminating a charging operation of the battery.

6. The system of claim 1, wherein the computer executable components further comprise:
a location component that determines the traveling direction of the user of the vehicle.

7. The system of claim 1, wherein the traveling direction of the user is toward the vehicle, and wherein the execution component pauses the action to prevent the vehicle from moving away from the current location.

8. The system of claim 7, wherein the computer executable components further comprise:
a timer component that determines whether an amount of time that the user travels toward the vehicle exceeds a defined threshold; and
wherein the action comprises the autonomous movement of the vehicle away from the current location in response to the amount of time exceeding the defined threshold.

9. The system of claim 1, wherein the traveling direction of the user is away from the vehicle.

10. The system of claim 1, wherein the vehicle comprises an electric automobile.

11. The system of claim 1, wherein the vehicle comprises an electric scooter or an electric bicycle.

12. A non-transitory machine-readable medium, comprising executable instructions that, when executed by a processor, facilitate performance of operations, comprising:
using a defined battery health algorithm and a battery sensor, determining degradation of a battery of a vehicle; and
mitigating further degradation of the battery by performing action selected based on the degradation of the battery and a traveling direction of a user of the vehicle relative to a current location of the vehicle, wherein the user is outside of the vehicle, wherein a cause of the degradation of the battery comprises overheating of the battery from exposure of the vehicle to sunlight in the current location, and wherein the action comprises autonomously moving the vehicle to a different location that is away from the sunlight.

13. The non-transitory machine-readable medium of claim 12, wherein the battery comprises a solid-state battery.

14. The non-transitory machine-readable medium of claim 12, wherein the battery comprises a multi-cell battery.

15. The non-transitory machine-readable medium of claim 14, wherein the degradation of the battery comprises degradation of a cell of the multi-cell battery wherein the operations further comprise:
preventing charging of the cell of the multi-cell battery.

16. The non-transitory machine-readable medium of claim 12, wherein the traveling direction of the user is away from the vehicle.

17. A method, comprising:
using a defined battery health algorithm and a battery sensor, determining, by a system comprising a processor, degradation of a battery of a vehicle; and
mitigating, by the system, further degradation of the battery by performing action selected based on the degradation of the battery and a traveling direction of a user of the vehicle relative to a current location of, wherein the user is outside of the vehicle, wherein a cause of the degradation of the battery comprises overheating of the battery from exposure of the vehicle to sunlight in the current location, and wherein the action comprises autonomously moving the vehicle to a different location that is away from the sunlight.

18. The method of claim 17, wherein the battery comprises a battery pack, and wherein the action comprises, based on the degradation of the battery pack and a defined charging algorithm, selectively charging one or more portions of the battery pack.

19. The method of claim 17, wherein the traveling direction of the user is away from the vehicle.

20. The method of claim 17, wherein the traveling direction of the user is toward the vehicle, and further comprising pausing, by the system, the action to prevent the vehicle from moving away from the current location.

\* \* \* \* \*